United States Patent [19]
Lawton et al.

[11] Patent Number: 5,773,146
[45] Date of Patent: Jun. 30, 1998

[54] FORMING SIZE COMPOSITIONS, GLASS FIBERS COATED WITH THE SAME AND FABRICS WOVEN FROM SUCH COATED FIBERS

[75] Inventors: Ernest L. Lawton, Allison Park; Xiang Wu, Gibsonia, both of Pa.

[73] Assignee: PPG Industries, Inc., Pittsburgh, Pa.

[21] Appl. No.: 463,909

[22] Filed: Jun. 5, 1995

[51] Int. Cl.$^6$ ........................................................ B32B 9/00
[52] U.S. Cl. ........................ 428/392; 428/375; 428/378; 428/391; 428/395; 428/394
[58] Field of Search .................................... 428/375, 392, 428/391, 378, 394, 395

[56] References Cited

U.S. PATENT DOCUMENTS

| | | | |
|---|---|---|---|
| B 319,414 | 1/1975 | Morrison et al. | 117/126 GQ |
| 2,723,215 | 11/1955 | Biefeld et al. | 154/91 |
| 2,803,565 | 8/1957 | Sagar | 117/139.5 |
| 3,167,468 | 1/1965 | Lovelace et al. | 161/175 |
| 3,227,192 | 1/1966 | Griffiths | 139/420 |
| 3,265,516 | 8/1966 | Triplett et al. | 106/213 |
| 3,615,311 | 10/1971 | Ignatius | 65/3 |
| 3,655,353 | 4/1972 | Nalley et al. | 65/3 |
| 3,664,855 | 5/1972 | Morrison et al. | 106/212 |
| 3,793,065 | 2/1974 | Morrison et al. | 117/126 GQ |
| 3,869,308 | 3/1975 | Graham | 117/126 GB |
| 3,887,389 | 6/1975 | Hedden | 106/212 |
| 3,928,666 | 12/1975 | Morrison et al. | 428/378 |

(List continued on next page.)

FOREIGN PATENT DOCUMENTS

| | | |
|---|---|---|
| 0424701 | 5/1991 | European Pat. Off. . |
| 218760 | 2/1985 | Germany . |
| 62260738 | 11/1987 | Japan . |
| 1-242444 | 9/1989 | Japan . |
| WO 94/04731 | 3/1994 | WIPO . |
| WO94/25522 | 11/1994 | WIPO . |

OTHER PUBLICATIONS

D. Shaw, *Introduction to Colloid and Surface Chemistry*, 3rd Ed. (1980), pp. 237–238; 265.
*Encyclopedia of Polymer Science and Technology*, vol. 9 (1980) pp. 291–310; vol. 10 (1969) pp. 228–229; vol. 14 (1971) pp. 239–251.
Whaling Convention Act, 16 U.S.C.A. S916, 1995.
A. Warth, The Chemistry and Technology of Waxes, pp. 141–149; 473–474; 582–590; 877–878 (2d Ed. 1956).
H. Bennett, Vo. 1, Industrial Waxes, pp. 160–161 (1963).
L. Cole et al., "Chromatographic Isolation of the Original Consitutents of Natural Waxes. The Composition of Ouricuri Wax", 37 *J. Amer. Oil Chem. Soc.*, pp. 959–963, Jul. (1960).
P. Molyneux, *Water Soluble Synthetic Polymers*, vol. 1 (1984), pp. 146–178.
K. Loewenstein, The Manufacturing Technology of Continous Glass Fibres (2d Ed. 1983) pp. 33–45; 169–177; 224–230; 253; 263.
Kirk–Othmer, *Encyclopedia of Chemical Technology*, vol. 22, pp. 166–167, 1970.
*Hawley's Condensed Chemical Dictionary* (1993) p. 796.
"KESSCO Cetyl Palmitate 653" Product Bulletin of Stepan Co.

*Primary Examiner*—Patrick Ryan
*Assistant Examiner*—J. M. Gray
*Attorney, Agent, or Firm*—Ann Marie Odorski

[57] ABSTRACT

Aqueous forming size compositions for treating a plurality of glass fibers include an oleophobic starch; a N-vinyl amide polymer; a wax component containing an ester formed from reacting (a) a monocarboxylic acid and (b) a monohydric alcohol; an emulsifying agent for the wax component; and a cationic lubricant different from the wax component. The forming size composition is essentially free of: (1) oleophilic starches; (2) polyolefin emulsions; and (3) preservatives selected from organometallic compounds, formaldehydes, derivatives and mixtures thereof. Glass fibers sized and coated with such compositions can be woven into fabrics.

21 Claims, 1 Drawing Sheet

U.S. PATENT DOCUMENTS

| | | | |
|---|---|---|---|
| 3,932,193 | 1/1976 | Graham | 106/211 |
| 3,946,132 | 3/1976 | Hedden | 428/378 |
| 4,002,445 | 1/1977 | Graham | 65/3 |
| 4,009,317 | 2/1977 | Chase et al. | 428/378 |
| 4,039,716 | 8/1977 | Johnson | 428/378 |
| 4,066,106 | 1/1978 | Graham | 139/420 |
| 4,143,006 | 3/1979 | Workman | 260/17.4 |
| 4,197,349 | 4/1980 | Walser | 428/378 |
| 4,221,602 | 9/1980 | Walser | 106/211 |
| 4,233,046 | 11/1980 | Walser | 65/3 |
| 4,259,190 | 3/1981 | Fahey | 252/8.6 |
| 4,296,173 | 10/1981 | Fahey | 428/378 |
| 4,374,177 | 2/1983 | Hsu et al. | 428/392 |
| 4,394,418 | 7/1983 | Temple | 428/391 |
| 4,394,475 | 7/1983 | Temple et al. | 524/262 |
| 4,397,913 | 8/1983 | Fahey | 428/369 |
| 4,470,252 | 9/1984 | Brodmann | 57/309 |
| 4,530,876 | 7/1985 | Brodmann et al. | 428/283 |
| 4,610,707 | 9/1986 | Grundy | 65/2 |
| 4,762,750 | 8/1988 | Girgis et al. | 428/378 |
| 4,762,751 | 8/1988 | Girgis et al. | 428/378 |
| 4,932,108 | 6/1990 | Brodmann | 28/271 |
| 5,120,363 | 6/1992 | Puckett | 106/213 |
| 5,286,562 | 2/1994 | Girgis | 428/391 |
| 5,334,639 | 8/1994 | Rice | 524/47 |
| 5,354,829 | 10/1994 | Swisher et al. | 528/10 |
| 5,393,335 | 2/1995 | Puckett et al. | 106/211 |

FORMING SIZE COMPOSITIONS, GLASS FIBERS COATED WITH THE SAME AND FABRICS WOVEN FROM SUCH COATED FIBERS

FIELD OF THE INVENTION

This invention relates generally to aqueous forming size compositions for treating glass fibers including an oleophobic starch, a N-vinyl amide polymer and a wax component comprising an ester formed from reacting (1) a monocarboxylic acid and (2) a monohydric alcohol.

BACKGROUND OF THE INVENTION

Typically, the surfaces of glass fibers are coated with a size composition during the forming process to protect the glass fibers from interfilament abrasion. As used herein, "size" or "sizing" means the aqueous forming size composition applied to glass fibers immediately after formation of the glass fibers. Such forming size compositions typically include as components film-formers, lubricants, coupling agents, emulsifiers, antioxidants, ultraviolet light stabilizers, colorants, antistatic agents and water, to name a few.

Japanese Patent Application No. 1242444 discloses a sizing agent for glass fibers that contains starches, aliphatic hydrocarbon or higher fatty acid ester lubricant formed from combinations of higher mono-, di- or oxycarboxylic acids with polyols or monohydric alcohols such as butanol or octanol, softener and an organotin compound or formalin preservative. Organotin and formalin preservatives are not desirable components for forming size compositions because of health and environmental concerns, such as legislation regulating the content of various metals in wastewater.

U.S. Pat. No. 4,143,006 (Workman) discloses a size composition for treatment of glass fibers as reinforcement for paper comprising a starch, a polyolefin emulsion and a lubricant. The composition may include paraffin waxes or lubricants such as are formed by reaction of a long-chain fatty acid with a polyalkylene polyamine or esters of saturated long-chain fatty acids or fatty alcohols (Spermafol 5200). It is believed that including such polyolefin emulsions in glass fiber sizing compositions produce coated glass fibers having undesirably high processing tension under certain typical processing conditions.

U.S. Pat. No. 3,869,308 discloses a glass fiber sizing composition consisting essentially of a starch; the salt of a polyamino functional polyamide resin; a wax; and 9–77 weight percent of a fatty triglyceride.

Similarly, U.S. Pat. No. 4,259,190 (Fahey) discloses a glass fiber sizing composition comprising a starch mixture; a wax; a non-ionic lubricant having fatty triglycerides; an alkyl imidazoline softener; an emulsifying mixture and, optionally, a silane or siloxane coupling agent.

U.S. Pat. No. 4,932,108 discloses a bulking process for glass fiber strands in which the strands are coated with a thermoplastic material such as a wax, a plasticizer if the film is brittle or discontinuous, emulsifiers, cationic lubricant, wetting agent, and starch.

U.S. Pat. No. 4,397,913 discloses a sizing composition for bulking operations including a modified starch, nonionic lubricants, wax, emulsifiers, plasticizer, ester-modified amino silane coupling agent, biocide, fungicide and cationic lubricant. As used herein, "plasticizer" means "a material incorporated in a plastic to increase its workability and its flexibility or distensibility . . . . Organic plasticizers are usually moderately high-molecular-weight liquids or occasionally low-melting solids." *Encyclopedia of Polymer Science and Technology*, Vol. 10 (1969) at 228–229, which is hereby incorporated by reference.

U.S. Pat. No. 4,530,876 discloses a slashing or warp sizing composition including a polyvinyl alcohol polymer, a secondary film former and optionally a wax such as spermaceti wax or a lubricant such as a straight chain fatty acid having 12 to 32 carbons and hydroxylated derivatives and mixtures thereof. Slashing or warp sizing compositions are applied to glass fibers, which have the dried residue of a forming size thereon, after the warping or beaming process to protect the glass fibers during the weaving process.

U.S. Pat. Nos. 3,664,855; 3,793,065 and 3,928,666 and U.S. Published patent application Ser. No. B 319,414 (all of Morrison et al.) disclose sizes for lubricating fibers consisting essentially of an oleophilic starch ether of a monocyclic hydrocarbon or oleophilic starch ester of a cyclic hydrocarbon or isoalkanoic acid; a solid unctuous material such as hydrogenated sperm oil wax (SPERMAFOL) or spermaceti wax, vegetable, mineral or synthetic waxes, a cationic lubricant and emulsifier. According to the Morrison patents and published application, cyclic hydrocarbon ethers or esters and isoalkanoic esters modify the nature of starch so as to change it from an oleophobic one to a slightly oleophilic one to make the starch compatible and have an affinity for solid predominately hydrocarbon unctuous materials. U.S. Pat. Nos. 3,664,855 at column 3, lines 17–22; 3,793,065 at column 1, lines 32–36; 3,928,666 at column 1, lines 32–37; and U.S. Published patent application Ser. No. B 319,414 at column 1, lines 31–36.

Natural spermaceti wax and sperm oil are believed to be no longer commercially available in the United States since legislation has banned the possession and sale of whale products in the United States. See Whaling Convention Act, 16 U.S.C.A. § 916.

Sized or treated glass fibers are typically gathered into a strand, wound to form a forming package, and dried. Optionally, a secondary coating can be applied to the strands. The strands can be twisted into a yarn or bulked. Twisted strands can be used as fill yarn or warped or beamed and a warp or slashing size can be applied to the glass fibers to protect them from abrasion during a subsequent weaving process. Alternatively, the strands can be chopped, combined in parallel to form a bundle or roving, knit or woven into a cloth or formed into a chopped or continuous strand mat, or example.

The strands must withstand these rigorous processing conditions while maintaining various properties such as low broken filaments, which can accumulate at contact points such as guide eyes and tensioning devices, low strand tension, adequate wet-out in slashing and high fliability and low insertion time in weaving.

Fuzz and halos are examples of types of broken filaments which accumulate at various contact points. As used herein, "wet-out" means the relative elapsed time for penetration of a slashing solution into a yarn bundle. Wet-out can be determined by using a modified version of the Draves test (standard test (unmodified) is ASTM D-2281), which will be further described in the Example to follow. Insertion time is the elapsed time from the start of the weaving cycle for yarn to traverse the width of the fabric and pass the selvage or edge of the opposite side of the fabric from the air jet nozzle of the loom. Fliability refers to the amount of yarn delivered in a specified time through a loom air jet nozzle held at a fixed air pressure.

The sized strands can be processed into a wide variety of configurations, for example braids, knits, tapes, mats, and woven and non-woven fabrics, useful in many applications, such as cloth for printed circuit boards for the computer industry, knits for orthopedics or overwrap reinforcements for optical fiber cables, for example. Printed circuit board applications have stringent requirements for low broken filaments, abrasion resistance, effective operation and acceptable strand insertion times in modern high speed looms and acceptable wet-out in slashing operations and size removal in heat cleaning. Overwrap reinforcements for optical fiber cables also must meet stringent requirements in view of the severe service conditions to which they are exposed.

SUMMARY OF THE INVENTION

The present invention provides aqueous forming size compositions for treating a plurality of glass fibers comprising: (a) an oleophobic starch; (b) a film-forming material which is a N-vinyl amide polymer; (c) a wax component comprising an ester formed from reacting (1) a monocarboxylic acid and (2) a monohydric alcohol; (d) an emulsifying agent for the wax component; and (e) a cationic lubricant different from the wax component; the aqueous forming size composition being essentially free of: (1) oleophilic starches; (2) polyolefin emulsions; and (3) preservatives selected from the group consisting of organometallic compounds, formaldehydes, derivatives and mixtures thereof.

Also provided in accordance with the present invention are sized glass fibers coated with such compositions and fabrics woven from such coated fibers.

BRIEF DESCRIPTION OF THE DRAWING

The foregoing summary, as well as the following detailed description of the invention, will be better understood when read in conjunction with the appended drawing. In the drawing.

DETAILED DESCRIPTION OF THE PREFERRED EMBODIMENT

Figure 1:
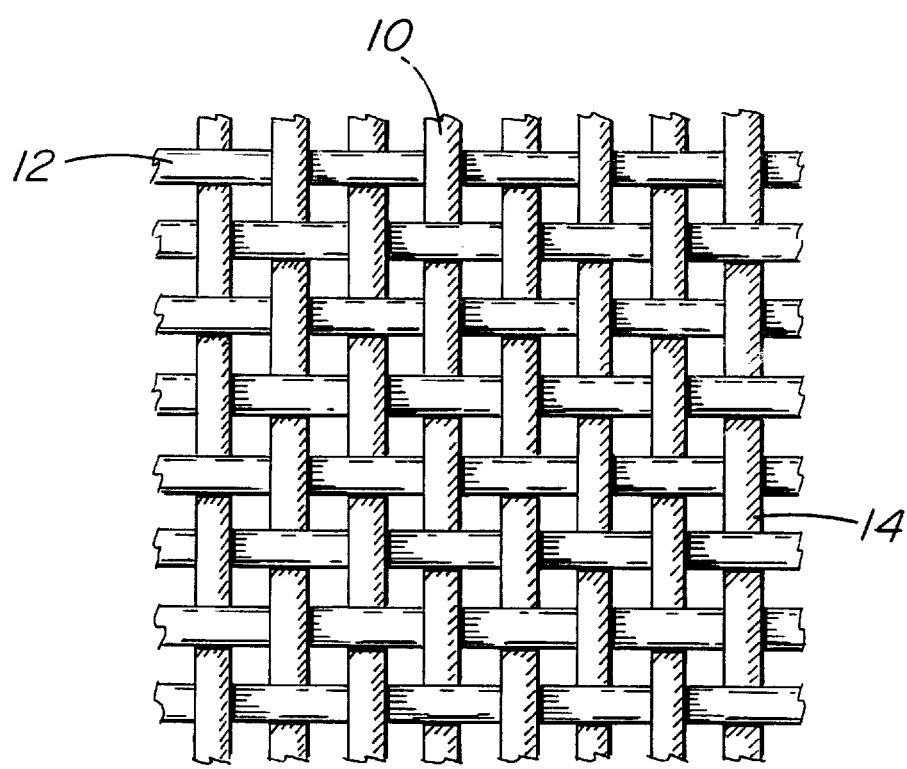
FIG. 1 is a top plan view of a portion of a woven fabric according to the present invention.

The aqueous forming size composition of the present invention provides glass fiber strands having a variety of advantageous properties, including minimum fuzz and halos, low broken filaments, low strand tension, adequate wet-out in slashing and high fliability and low insertion time in weaving. Glass fiber strands treated with the aqueous forming size composition of the present invention can withstand a wide variety of further processing operations such as twisting, chopping, forming into a bundle, roving, chopped mat or continuous strand mat or weaving or knitting into a cloth. Such strands are useful in a wide variety of applications, such as cloth for printed circuit boards, knits for orthopedics, and overwrap reinforcements for optical fiber cables.

Broadly stated, the aqueous forming size composition comprises an oleophobic starch, a film-forming material which is a N-vinyl amide polymer, a wax component comprising an ester formed from reacting (1) a monocarboxylic acid and (2) a monohydric alcohol, an emulsifying agent for the wax component, and a cationic lubricant different from the wax component.

Oleophobic starches are defined herein to mean those starches which are not compatible with, do not have an affinity for and/or are not capable of dissolving in, yet can be dispersed in, solid predominately hydrocarbon unctuous materials, such as a wax, fat or gelled oil.

It has been observed that oleophobic starches, when used with a wax component comprising an ester formed from reacting (1) a monocarboxylic acid and (2) a monohydric alcohol, in a forming size composition provide glass fibers coated therewith having acceptable low tension in processing, good wet-out in slashing and good heat cleanability, i.e., the forming size composition is easily and essentially fully removable by heat treatment at temperatures of about 350° C. to about 400° C. for about 10 to about 20 hours.

Oleophobic starches which are useful in the present invention include those starches having a viscosity of less than about 100 centipoise at a temperature of about 38° C. (100° F.) and starches having a viscosity of greater than about 100 centipoise at a temperature of about 38° C. (100° F.), derivatives of these starches and mixtures thereof. A "low-viscosity" starch is defined herein to mean a starch with a post-cook viscosity of about 100 centipoise or less at a temperature of about 38° C. (100° F.) and a 6 percent solids level. A "high-viscosity" starch is defined herein to mean a starch with a post-cook viscosity greater than or equal to about 100 centipoise at a temperature of about 38° C. (100° F.) and a 6 percent solids level. The viscosity is measured using a No. 61 spindle on a Brookfield Viscometer Model No. DV2+ at about 12 revolutions per minute (rpm). Preferably, the starch component of the forming size composition of the present invention comprises about 50 to about 90 weight percent of a high viscosity starch.

Also useful in the present invention are oleophobic starches having an amylose content of less than about 40 weight percent and oleophobic starches having an amylose content of greater than about 40 weight percent, derivatives of the starches and mixtures thereof. As used herein, "high amylose content" means a starch having an amylose content greater than about 40 weight percent on a total solids basis. As used herein, "low amylose content" means a starch having an amylose content less than about 40 weight percent on a total solids basis, and preferably about 10 to about 40 weight percent. Starches having high amylose contents are typically derived from corn starch or hybrid corn starch, whereas starches having a low amylose content can be derived from potato, tapioca or modified corn starches.

Starches useful in the present invention can be modified by acetylation, chlorination, acid hydrolysis, derivatizing agents which do not render the starch oleophilic, such as phosphatizing, ethoxylating or etherifying agents, crosslinking agents or enzymatic action, for example. Such starches can be crosslinked by treatment with difunctional agents which are capable of reacting with hydroxyl groups on two different molecules in the starch granule. Also useful in the present invention are stabilization derivatives of starches produced by reacting monofunctional reagents with hydroxyl groups on the starch.

The starches useful in the present invention preferably do not include oleophilic starches such as the oleophilic starch ethers of monocyclic hydrocarbons or oleophilic starch esters of cyclic hydrocarbons or isoalkanoic acids, such as are discussed in U.S. Pat. Nos. 3,664,855; 3,793,065 and 3,928,666 and U.S. Published patent application Ser. No. B 319,414.

Such oleophilic starch modification is not believed to be necessary in the present invention and can increase the cost of preparing a sizing composition. It is preferred that the aqueous forming size composition of the present invention be essentially free of oleophilic starches. As used herein, the phrase "essentially free of oleophilic starches" means that the aqueous forming size composition has less than five weight percent of oleophilic starches on a total solids basis, and preferably less than about two weight percent of oleophilic starches.

Oleophilic starches are believed to modify the smearing nature of solid unctuous materials to provide low tensions when glass fiber strands coated with oleophilic starch and unctuous materials are pulled over guide surfaces. U.S. Pat. No. 3,664,855 at column 3, lines 9–40, which is hereby incorporated by reference. In the present invention, modification of the starch to make it oleophilic is believed unnecessary because desirable tensions can be achieved by the use of oleophobic starch and the ester formed from reacting a monocarboxylic acid and a monohydric alcohol.

Preferred oleophobic starches include those derived from potatoes and corn. Other useful starches include those prepared from wheat, waxy maize, sago, rice and milo.

Non-limiting examples of useful oleophobic starches include KOLLOTEX 1250 (a low viscosity, low amylose potato-based starch etherified with ethylene oxide which is commercially available from AVEBE of the Netherlands), NATIONAL 1554 (a high viscosity, low amylose crosslinked potato starch), HI-SET 369 (a low viscosity starch), Hylon and NABOND high viscosity starches (which are commercially available from National Starch and Chemical Corp. of Bridgewater, N.J.), AMAIZO 213 (a high viscosity, crosslinked starch) and other oleophobic AMAIZO starches which are commercially available from American Maize Products Company of Hammond, Ind. HI-SET 369 is a propylene oxide modified corn starch having an amylose/amylopectin ratio of about 55/45.

Preferably, the oleophobic starch is a blend of NATIONAL 1554 and AMAIZO 213 starches. Alternatively, the oleophobic starch can be a blend of NATIONAL 1554 and HI-SET 369 starches. In another alternative embodiment, a single starch such as KOLLOTEX 1250 is used.

The total percentage of oleophobic starch in the forming size composition is about 10 to about 90 weight percent on a total solids basis, preferably about 30 to about 75 weight percent and, more preferably, about 40 to about 65 weight percent. For the preferred blend of NATIONAL 1554 and AMAIZO 213 starches, the forming size composition includes about 24 weight percent each of NATIONAL 1554 and AMAIZO 213 starches on a total solids basis. The blend of NATIONAL 1554 and HI-SET 369 starches is preferably about 40 weight percent NATIONAL 1554 and about 17 weight percent HI-SET 369 starches. For the other alternative embodiment, about 56 weight percent KOLLOTEX 1250 is preferred.

Mixtures of any of the oleophobic starches discussed above are also useful in the present invention.

As previously mentioned, the aqueous forming size composition also comprises a film-forming material which is one or more N-vinyl amide polymers. The N-vinyl amide polymer is preferably prepared from a cyclic monomer, for example N-vinyl-2-pyrrolidone, N-vinyl-2-piperidone, N-vinyl-ε-caprolactam, N-vinyl-5-methyl-2-pyrrolidone, N-vinyl-3,3,5-trimethyl-2-pyrrolidone, N-vinyl-3-methyl-2-pyrrolidone, isomers, derivatives and mixtures thereof.

The n-vinyl amide monomer or mixture of monomers can be polymerized with various other addition polymerizable vinyl monomers, such as acrylonitrile, allyl alcohol, allyl acetate, ethylene, maleic anhydride, methyl methacrylate, styrene, vinyl acetate, vinyl chloride, vinylene carbonate, vinyl cyclohexyl ether and vinyl phenyl ether. *Encyclopedia of Polymer Science and Technology*, Vol. 14 (1971) pp. 239-251, 242, which is hereby incorporated by reference. Other examples of useful monomers for copolymerization with the cyclic monomer include ethyl acrylate and 2-ethylhexyl acrylate.

An example of a suitable polymerization reaction is the polymerization reaction of N-vinyl pyrrolidone by free radical, anionic and cationic mechanisms to yield polyvinyl pyrrolidone homopolymer. Suitable free radical initiators include azobisisobutyronitrile and hydrogen peroxide (optionally with ammonia or an amine). Vinyl pyrrolidone can also be polymerized photochemically using ultraviolet light. For a more detailed discussion of useful polymerization mechanisms, see P. Molyneux, *Water Soluble Synthetic Polymers*, Vol. 1 (1984) pp. 146–178, which is hereby incorporated by reference; and *Encyclopedia of Polymer Science and Technology*, at pp. 239–251.

The preferred N-vinyl amide polymer is a homopolymer of N-vinyl-2-pyrrolidone (poly-N-vinyl-2-pyrrolidone). The homopolymer of N-vinyl-2-pyrrolidone is readily soluble in water and many organic solvents. See *Encyclopedia of Polymer Science and Technology* at p. 243.

The four most common commercial grades of polyvinyl pyrrolidone are K-15, K-30, K-60 and K-90, which have the following corresponding weight average molecular weights ($M_w$): 10,000; 40,000; 160,000; and 360,000. K-30 grade polyvinyl pyrrolidone homopolymer is preferred.

Polyvinyl pyrrolidone is commercially available in a number of grades of different molecular weights from BASF Company of Parsippany, New Jersey. Preferred polyvinyl pyrrolidones include PVP K-15, PVP K-30, PVP K-60 and PVP K-90, each of which are commercially available from ISP Technologies, Inc., manufacturers for GAF Chemicals of Wayne, N.J.

An example of a useful polyvinyl pyrrolidone copolymer is PVP/VA S-630 polyvinyl pyrrolidone/vinyl acetate copolymer which is commercially available from ISP Technologies, Inc.

The N-vinyl amide film-forming polymer is present in the aqueous forming size composition in an amount from about 0.1 to about 30 weight percent on a total solids basis, preferably about 1 to about 10 weight percent and, more preferably, about 3 to about 8 weight percent.

The aqueous forming size composition further comprises one or more esters formed from reacting (1) a monocarboxylic acid and (2) a monohydric alcohol. Preferably, the wax component comprises at least about 90 weight percent of the ester on a total solids basis.

The ester is preferably a solid having a melting point of about 35° C. to about 135° C. and, more preferably, from greater than 45° C. to about 135° C. More preferred are esters having a melting point of about 45° C. to about 80° C.

Preferably, the ester includes less than about 10 weight percent of an unsaponifiable material. The ester can have a saponification number of about 60 to about 260, and preferably about 85 to about 165. The nonsaponifiable matter, or unsaponifiable material (unsaponifiable) "includes all substances that cannot be changed to water-soluble products by the process of saponification." A. Warth, *The Chemistry and Technology of Waxes* (2d Ed. 1956) page 589, which is hereby incorporated by reference. The non-saponifiable matter "includes not only the unsaponifiable portion of the wax such as the combined alcohols, split off from the ethers or esters as a result of saponification, but also hydrocarbons and free alcohols, and ketones, if any. Alcohols include sterols, if any, as well as aliphatic alcohols." A. Warth, *The Chemistry and Technology of Waxes* (2d Ed. 1956) pp. 141–149, 583 and 877–78, which is hereby incorporated by reference. "The saponification number is the number of milligrams of potassium hydroxide required to hydrolyze one gram of the wax material." *The Chemistry and Technology of Waxes* at page 584, which is hereby incorporated by reference.

The ester generally comprises an aliphatic chain having about 12 to about 32 carbon atoms, and preferably at least one of the monocarboxylic acid and the monohydric alcohol comprises an aliphatic chain having about 12 to about 32 carbon atoms.

Non-limiting examples of useful monocarboxylic acids include lauric acid, tridecanoic acid, myristic acid, pentadecanoic acid, palmitic acid, margaric acid, stearic acid, nonadecanoic acid, arachidic acid, behenic acid, lignoceric acid, cerotic acid, melissic acid and mixtures thereof. Preferred monocarboxylic acids are palmitic acid and myristic acid.

Useful monohydric alcohols include higher monohydric alcohols such as lauryl alcohol, n-tridecyl alcohol, myristal alcohol, n-pentadecyl alcohol, cetyl alcohol, margaryl alcohol, stearyl alcohol, n-nonadecyl alcohol, arachidyl alcohol, ceryl alcohol, myricyl alcohol, and mixtures thereof. The preferred monohydric alcohol is cetyl alcohol.

The monocarboxylic acid and monohydric alcohol can be reacted to form the ester by conventional esterification processes well known to those skilled in the art and such as are disclosed in *Encyclopedia of Chemical Technology*, Vol. 9 (1980) at pages 291–310, which is hereby incorporated by reference.

The preferred ester is cetyl palmitate which is the palmitic ester of cetyl alcohol, such as is commercially available from Stepan Company of Maywood, N.J. as KESSCO or STEPANLUBE 653 cetyl palmitate. Cetyl palmitate has a saponification number of about 109 to about 117. The chief constituent of spermaceti wax is cetyl palmitate, which comprises at least 90 percent. *The Chemistry and Technology of Waxes* at 142. Natural spermaceti wax is believed to be no longer commercially available in the United States. See Whaling Convention Act, 16 U.S.C.A. § 916 discussed above.

Another example of a useful ester is cetyl myristate, which has a melting point of about 47° to about 53° C. and a saponification number of about 116 to about 124. Cetyl myristate is commercially available as KESSCO or STEPHANLUBE 654 from Stepan Company.

The ester is present in the aqueous forming size composition in an amount from about 5 to about 50 weight percent of the aqueous forming size composition on a total solids basis, preferably about 20 to about 45 and, more preferably, about 10 to about 45 weight percent.

The aqueous forming size composition also comprises one or more emulsifying agents for the ester. The emulsifying agent is selected from the group consisting of cationic emulsifiers, anionic emulsifiers, nonionic emulsifiers and mixtures thereof. Non-limiting examples of useful non-ionic emulsifiers polyoxyalkylene block copolymers, ethoxylated alkyl phenols, polyoxyethylene octylphenyl glycol ethers, ethylene oxide derivatives of sorbitol esters, polyoxyethylated vegetable oils and mixtures thereof.

An example of a suitable polyoxypropylene-polyoxyethylene copolymer is the material PLURONIC™ F-108, which is commercially available from BASF Corporation of Parsippany, N.J. This material is a condensate of ethylene oxide with hydrophobic bases formed by condensation of propylene oxide with propylene glycol.

Examples of useful ethoxylated alkyl phenols include ethoxylated octylphenoxyethanol, phenoxy polyethyleneoxy(ethanol), phenoxy(ethyleneoxy)ethanol and nonyl phenoxy poly(ethyleneoxy)ethanol. An example of a commercially available ethoxylated octylphenoxyethanol is IGEPAL CA-630 from Rhone Poulenc of Princeton, New Jersey.

An example of a polyoxyethylated vegetable oil is EMULPHOR EL-719, which is commercially available from GAF Corp. A useful polyoxyethylene octylphenyl glycol ether is TRITON X-100, which is commercially available from Union Carbide of Danbury, Connecticut. TWEEN 21 and 81 are examples of useful ethylene oxide derivatives of sorbitol esters, which are commercially available from ICI Americas, Inc. of Wilmington, Del. The preferred emulsifier is TMAZ 81, an ethylene oxide derivative of a sorbitol ester emulsifier which is available from PPG Industries, Inc. of Pittsburgh, Pa.

Generally, the amount of emulsifying agent can be about 0.01 to about 25 weight percent of the forming size composition on a total solids basis, and is more preferably about 0.1 to about 10 weight percent.

The emulsifying agent can be a mixture of emulsifiers. Preferably, a mixture of emulsifiers has a hydrophile/lipophile balance value of about 5 to about 18. As used herein, "hydrophile/lipophile balance value" means the value on an empirical scale which expresses the amphiphilic nature of an emulsifying agent. The hydrophile/lipophile balance is discussed in detail in D. Shaw, *Introduction to Colloid and Surface Chemistry* (1980) at page 237–238 and 265, which is hereby incorporated by reference.

The aqueous forming size composition also comprises one or more cationic lubricants different from the ester. Non-limiting examples of such cationic lubricants are glass fiber lubricants which include amine salts of fatty acids (which can, for example, include a fatty acid moiety having 12 to 22 carbon atoms and/or tertiary amines having alkyl groups of 1 to 22 atoms attached to the nitrogen atom), alkyl imidazoline derivatives (such as can be formed by the reaction of fatty acids with polyalkylene polyamines), acid solubilized fatty acid amides (for example, saturated or unsaturated fatty acid amides having acid groups of 4 to 24 carbon atoms such as stearic amide), acid solubilized polyunsaturated fatty acid amides, condensates of a fatty acid and polyethylene imine and amide substituted polyethylene imines, such as EMERY 6717, a partially amidated polyethylene imine commercially available from Henkel Corporation of Kankakee, Ill. and ALUBRASPIN 226 which is available from PPG Industries, Inc.

Useful alkyl imidazoline derivatives are CATION X, which is commercially available from Goldschmidt Chemical Corporation of Hopewell, Va. or ALUBRASPIN 261, which is available from PPG Industries, Inc.

Preferably, the cationic lubricant is one or more silylated polyamine polymers which can, for example, be prepared by reacting: (a) an amino functional reaction product of an aminofunctional polymer having primary or secondary amine functionality and the residue of a fatty acid moiety; and (b) an amine-reactable organo alkoxy silane and hydrolysis products thereof.

U.S. Pat. No. 5,354,829 at column (col.) 1, line 1 through col. 2, line 18; col. 2, line 20 through col. 5, line 18; col. 5, line 24 through col. 7, line 37; col. 7, line 40 through col. 10, line 15; col. 10, line 34 through col. 11, line 1; col. 11, line 5 through col. 27, line 57; col. 28, line 26 through col. 32, line 33; and col. 33, line 11 through col. 36, line 35 provides a detailed description of silylated polyamine polymers useful in the present invention and is hereby incorporated by reference.

The silylated polyamine polymer (also referred to as the "Silylated RP Polymer" in U.S. Pat. No. 5,354,829) has cationic lubricating properties and can have a residual amine value of about 200 to about 800 and a residual acid value of up to about 20.

The amino functional reaction product (also referred to as "Polyamine I" in U.S. Pat. No. 5,354,829) comprises the reaction product of one or more polyamines comprising primary or secondary amines having amine functionality and one or more fatty acids, dimer acids such as polymeric fat acids or derivatives thereof.

Non-limiting examples of suitable polyamines include polyalkylene polyamines such as partially amidated polyamines, polyalkylene imines, polyamine-polyamides and amido amine polymers. Suitable polyamines are discussed in U.S. Pat. No. 5,354,829 at col. 2, lines 20–25; col. 3, line 7 through col. 5, line 19; col. 5, line 24 through col. 9, line 57. Useful polyamines can further include tertiary amine functionality in addition to the primary or secondary amine functionality.

Fatty acids useful in the present invention (also referred to as "Fatty Acid Materials" in U.S. Pat. No. 5,354,829) include fatty acids and derivatives thereof, such as fatty acids esters, fatty acid anhydrides, fatty acid halides and polymerized fatty acids. Examples of suitable fatty acids are discussed in U.S. Pat. No. 5,354,829 at col. 8, lines 20 through col. 9, line 57 and include acetic, pelargonic, 2-ethylhexoic, isononanoic, oleic, undecylenic, caprioc, caprylic, octanoic, capric, lauric and stearic acids.

Suitable polymerized fatty acids (also referred to as the "polymeric fat acid" in U.S. Pat. No. 5,354,829) are discussed in U.S. Pat. No. 5,354,829 at col. 8, line 56 through col. 9, line 21.

The amino functional reaction product can further include chain extenders such as are discussed in U.S. Pat. No. 5,354,829 at col. 4, line 50 through col. 8, line 19. Chain extended amino functional reaction products can be produced by reacting a polyamine with a fatty acid and a chain extender. As used herein, "chain extender" means compounds in which di-or polyfunctional moieties of the chain extender can react with the nitrogen through the active hydrogens of a residual amine of the polyamine to form a covalent bond to thereby increase the molecular weight of the amino functional reaction product. Examples of chain extenders are discussed in U.S. Pat. No. 5,354,829 at col. 7, lines 17–58.

An example of reactions through which chain extended amino functional reaction products can be formed is set forth at col. 4, line 50 through col. 5, line 18 and col. 5, line 29. In reaction equations (I) through (VII), x ranges from 2 to 6, y ranges from 6 to 16, w and z have values to provide a molecular weight up to around 50,000 Mw but preferably up to about 10,000 Mw to maintain a reasonable viscosity, R is a lower alkyl and R" is selected from alkylene, difunctional alkyl and/or aryl radicals having 2 to 15 carbon atoms.

Examples of suitable polyamines for chain extension are discussed in U.S. Pat. No. 5,354,829 at col. 6, lines 26–49 and include polyalkylene amines such as diethylenetriamine (DETA), triethylenetetraamine (TETA), tetraethylenepentamine (TEPA), pentaethylenehexamine (PEHA), dipropylenetriamine (DPTA), tripropylenetetramine (TPTA), tetrapropylenepentamine (TPPA) pentapropylenehexamine (PPHA), dihexamethylenetriamine (DHMTA), and mixtures thereof.

The amine-reactable organo alkoxy silane and hydrolysis products thereof (hereinafter collectively referred to as the "Amine-reactable silane" (as referred to in U.S. Pat. No. 5,354,829)). The term "amine-reactable" as used herein means the Amine-reactable silane has or is capable of having one or more reactive moieties in the organofunctional portion of the compound that can form a covalent bond with the amine functionality of the amino functional reaction product, for example one which can react with the active hydrogens of the amine functionality of the amino functional reaction product.

Non-limiting examples of suitable reactive moieties for the Amine-reactable silane include epoxy or glycidyl groups, isocyanato groups, ester groups, alkyl halo groups and acryloxy groups and are discussed in U.S. Pat. No. 5,354,829 at col. 9, lines 34–59. For example, suitable epoxy functional Amine-reactable silanes include those of the formula: $CH_2CH(O)$—$CH_2O$—$(CH_2)_x$—$Si(OR)_3$ or the formula: $CH_2CH(O)$—C—$(CH_2)_x$—$Si(OR)_3$ where x is an integer from 1 to 6 and R is a lower alkyl, for example methyl, ethyl, propyl, isopropyl or the like. Non-limiting examples of useful epoxy silanes include gamma-glycidoxyalkyltrialkoxy silane where the alkoxy group can be methoxy or ethoxy, delta-glycidoxybutyltrimethoxy silane and beta-glycidoxyethyltriethoxy silane.

Suitable Amine-reactable silanes also include those organofunctional alkoxy silanes which are not originally amine-reactable but can be modified to react with the amine functionality of the amino functional reaction product.

Suitable amine-reactable organo alkoxy silanes can have the following formula (I):

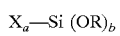

where X is an organic radical having an amine-reactable moiety. X can also include alkyl radicals such as are disclosed in U.S. Pat. No. 5,354,829 at col. 2, lines 46–50. The term "a" is an integer of 1 to 2 and "b" is an integer equal to 4-a. The term "R" is selected from hydrogen, alkyl radicals containing 1 to 6 carbon atoms, cycloalkyl, aryl and alkylaryl radicals containing 6 to 10 carbon atoms.

The silylated polyamine polymer can be formed by reaction of the amino functional reaction product and amine-reactable organo alkoxy silane by any order of addition in the proper molar ratio. Further details for preparing suitable silylated polyamine polymers are set forth in U.S. Pat. No. 5,354,829 at col. 11, lines 5–53 and col. 17, line 53 through col. 21, line 3.

The preferred cationic lubricant is ALUBRASPIN 227 silylated polyamine polymer lubricant which is manufactured by PPG Industries, Inc. of Pittsburgh, Pa. and is disclosed in U.S. Pat. No. 5,354,829.

The amount of cationic lubricant can be less than about weight percent of the forming size composition on a total solids basis, preferably about 0.1 to about 10 weight percent, and more preferably about 1 to about 5 weight percent.

The forming size composition can further include one or more surface modifying or coupling agents selected from functional organo silane, organo titanate and organo zirconate coupling agents. Such coupling agents typically have dual functionality. Each metal or silicon atom has attached to it one or more hydrolyzable groups which can react with the glass surface to remove hydroxyl groups and one or more groups which we believe can compatibilize or react with other components in the forming size composition, such as the N-vinyl amide polymer. Examples of hydrolyzable groups include:

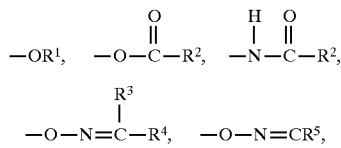

and the monohydroxy and/or cyclic $C_2$–$C_3$ residue of a 1,2- or 1,3 glycol, wherein $R^1$ is $C_1$–$C_3$ alkyl; $R^2$ is H or $C_1$–$C_4$ alkyl; $R^3$ and $R^4$ are independently selected from H, $C_1$–$C_4$ alkyl or $C_6$–$C_8$ aryl; and $R^5$ is $C_4$–$C_7$ alkylene. Examples of suitable compatibilizing groups include epoxy, glycidoxy, mercapto, cyano, allyl, alkyl, urethano, halo, isocyanato, ureido, imidazolinyl, vinyl, acrylato, methacrylato, amino or polyamino groups.

Functional organo silane coupling agents are preferred for use in the present invention. Examples of suitable functional organo silane coupling agents include 3-aminopropyldimethylethoxysilane, gamma-aminopropyltriethoxysilane, gamma-aminopropyltrimethoxy-silane, beta-aminoethyltriethoxysilane, N-beta-aminoethyl-aminopropyltrimethoxysilane, gamma-isocyanatopropyltriethoxy-silane, vinyl-trimethoxysilane, vinyl-triethoxysilane, allyl-trimethoxysilane, mercaptopropyltrimethoxysilane, mercaptopropyltriethoxysilane, glycidoxypropyltriethoxysilane, glycidoxypropyltrimethoxysilane, 4,5-epoxycyclohexyl-ethyltrimethoxysilane, ureidopropyltrimethoxysilane, ureidopropyltriethoxysilane, chloropropyltrimethoxysilane, and chloropropyltriethoxysilane.

Non-limiting examples of useful functional organo silane coupling agents include epoxy (A-187 gamma-glycidoxypropyltrimethoxysilane), methacrylate (A-174 gamma-methacryloxypropyltrimethoxysilane) and amino (A-1100 gamma-aminopropyltriethoxysilane and Y5659 amino silane coupling agents, each of which are commercially available from OSi Specialties, Inc. of Danbury, Conn. Other examples of useful silane coupling agents are set forth in K. Loewenstein, *The Manufacturing Technology of Continuous Glass Fibres* at page 263 (2d Ed. New York 1983), which is hereby incorporated by reference.

The amount of functional organo silane coupling agent can be about 0.5 to about 25 weight percent of the forming size composition on a total solids basis, and is preferably about 1 to about 10 weight percent and more preferably about 1 to about 5 weight percent.

The aqueous forming size composition can further comprise one or more non-ionic lubricants different from the ester, which are believed to increase tension in warping. Useful non-ionic lubricants include esters of carboxylic acids and polyhydric alcohols, and mineral oils.

Useful carboxylic acids include monocarboxylic acids, dicarboxylic acids, polycarboxylic acids and mixtures thereof. Non-limiting examples of suitable monocarboxylic acids include caprylic, caprio, lauric, lauroleic, myristic, myristoleic, pentadecanoic, palmitic, palmitoleic, margaric, stearic, oleic, linoleic, linolenic and ricinoleic acids.

Suitable polyhydric alcohols can be aromatic, aliphatic or cycloaliphatic or mixtures thereof. Non-limiting examples of aliphatic polyhydric alcohols include glycols such as ethylene glycol, diethylene glycol, triethylene glycol, 1,2- propylene glycol, 1,4-butylene glycol, 2,3-butylene glycol, pentamethylene glycol, polyoxyalkylene glycol; polyols such as sorbitol, glycerol, 1,2,6-hexanetriol, erythritol and trimethylolpropane; and mixtures thereof.

Non-limiting examples of useful non-ionic lubricants include vegetable oils and hydrogenated vegetable oils, such as cottonseed oil, corn oil and soybean oil; trimethylolpropane triesters; pentaerythritol tetraesters; derivatives and mixtures thereof. Useful trimethylolpropane triesters and pentaerythritol tetraesters are commercially available from Stepan Company. The non-ionic lubricants are typically solids or liquids at ambient temperature (about 25° C.).

A preferred non-ionic lubricant is ECLIPSE 102 ydrogenated soybean oil which is commercially available from Van den Bergh Foods Company of Lisle, Ill. The non-ionic lubricant is generally present in the aqueous forming size composition in an amount of about 0.001 weight percent to less than about 15 weight percent on a total solids basis, and preferably about 5 to about 15 weight percent.

The emulsifying agent can also function as an emulsifier for the non-ionic lubricants, or a second emulsifying agent different from the emulsifying agent for the wax component can be included in the aqueous forming size composition. Any of the emulsifying agents discussed above are also suitable emulsifiers for the non-ionic lubricant.

The wax component of the forming size composition can also include one or more aqueous soluble, emulsifiable or dispersible waxes different from the ester which has been described in detail above. Examples of such waxes include vegetable, animal, mineral, synthetic or petroleum waxes. Preferably, the wax has a high degree of crystallinity and is obtained from a paraffinic source, such as a microcrystalline wax. Other useful microcrystalline waxes are commercially available from Petrolite Corp. of Tulsa, Okla. and Michelman, Inc. of Cincinnati, Ohio. However, it is preferred that the forming size composition be essentially free of waxes different from the ester. As used herein, "essentially free of waxes different from the ester" means the forming size composition preferably comprises about 0.1 to about 5 weight percent of the forming size composition on a total solids basis.

Fungicides, bactericides and anti-foaming materials can also be included in the forming size composition. An example of a useful fungicide is methylene-bis-thiocyanate CHEMTREAT CL-2141, which is commercially available from ChemTreat, Inc. Of Ashland, Va. Suitable anti-foaming materials are the AG materials which are commercially available from OSi specialties, Inc. of Danbury, Conn. and MAZU DF-136 which is commercially available from PPG Industries, Inc. The amount of fungicide, bactericide or anti-foaming materials can be about $1\times10_{-4}$ to about 5 weight percent of the forming size composition on a total solids basis.

The forming size composition can further comprise one or more organic acids in an amount sufficient to provide the aqueous forming size composition with a pH of about 3 to about 10, preferably about 4 to about 8. Non-limiting examples of organic acids suitable for use in the present invention include mono- and polycarboxylic acids and/or anhydrides thereof, such as acetic, citric, formic, propionic, caproic, lactic, benzoic, pyruvic, oxalic, maleic, fumaric, acrylic, methacrylic acids and mixtures thereof.

Water (preferably deionized) is the predominant solvent for the forming size composition and is present in an amount sufficient to facilitate application of a generally uniform coating upon the glass fibers. The weight percentage of solids of such an aqueous forming size composition can be about 0.5 to about 20 weight percent. Preferably, the weight percentage of solids is about 1 to about 10 weight percent and, more preferably, about 2 to about 8 weight percent.

The aqueous forming size composition is preferably essentially free of humectants. It is believed that humectants can cause the starch to be more sensitive to moisture and can cause more broken filaments and higher tensions under high temperature and humid processing conditions. Non-limiting examples of humectants include dihydric alcohols, polyhydric alcohols, ureas and mixtures thereof. Examples of polyhydric alcohols include polyalkylene polyols, polyoxyalkylene polyols and mixtures thereof. Nonlimiting examples of such humectants include polyethylene glycols such as MACOL E-300, which is commercially available from PPG Industries, Inc. of Pittsburgh, Pa. and Carbowax products, which are commercially available from Union Carbide Corp. of Danbury, Conn. Other humectants include glycerols such as are commercially available from Sigma Chemical and Dow Chemical USA of Midland, Mich. As used herein, "essentially free of humectants" means that the aqueous forming size composition preferably contains less than five weight percent of humectants based upon the total weight of the composition and more preferably less than about 3 weight percent.

Preferably, the N-vinyl amide polymer is the sole film-forming polymer other than the starch in the aqueous forming size composition. The aqueous forming size composition is further preferably essentially free of polyvinyl alcohols, ethylene oxide polymers, polyacrylates and polyacrylamides. Such components are believed to contribute to broken filaments. As used herein, "essentially free of polyvinyl alcohols, ethylene oxide polymers, polyacrylates and polyacrylamides" means that the aqueous forming size composition preferably contains less than five weight percent of polyvinyl alcohols, ethylene oxide polymers, polyacrylates and polyacrylamides based upon the total weight of the composition.

It is preferred that the aqueous forming size composition be essentially free of polyolefin emulsions, such as aqueous emulsions of polyolefins selected from polyethylene, polypropylene and copolymers of ethylene and propylene. Such polyolefin emulsions are believed to be hydrophobic and are believed to adversely affect wet-out in slashing, particularly under humid conditions or when water-based slashing sizes are used. An example of a high density polyethylene emulsion is PROTOLUBE HD which is commercially available from Sybron Chemicals of Birmingham, N.J. As used herein, "essentially free of polyolefin emulsions" means that the aqueous forming size composition preferably contains less than five weight percent of polyolefin emulsions based upon the total weight of the composition.

The aqueous forming size composition is also preferably essentially free of preservatives selected from organometallic compounds, formaldehydes, derivatives and mixtures thereof. Non-limiting examples of such preservatives include emulsified organotin compounds and formalin. As used herein, "essentially free of preservatives selected from organometallic compounds, formaldehydes, derivatives and mixtures thereof" means that the aqueous forming size composition preferably contains less than 0.01 weight percent of such preservatives on a total solids basis.

The aqueous forming size composition is further preferably essentially free of salts of polyamino functional polyamide resins, such as are obtained by the condensation of a polyamine with a difunctional fatty acid. Such salts of polyamino functional polyamide resins are believed to increase resistance to heat cleaning, cause darkening or discoloration the cloth in heat cleaning and produce slashing problems. Such polyamines can include alkyl amines having 2 to 8 carbon atoms. Such difunctional fatty acids include those obtained from the dimerization of fatty acids having 8 to 18 carbons atoms. Examples of salts of polyamino functional polyamide resins include the VERSAMID and GENAMID products which are commercially available from Henkel Corporation and EPICURE 3180 E-75 polyamide resin solution which is commercially available from Shell Chemical of Houston, Tex. The phrase "essentially free of salts of polyamino functional polyamide resins" means that the aqueous forming size composition preferably comprises less than about four and more preferably less than about 1 weight percent of salts of polyamino functional polyamide resins on a total solids basis.

The aqueous forming size composition of the present invention can be prepared by any suitable method well known to those of ordinary skill in the art. For example, the starch can be prepared by adding water (preferably deionized) at a temperature of about 10° C. to about 40° C. to a premix slurry tank and add the starch with continuous agitation until the starch is dispersed. The starch is cooked in a cooker such as a standard jet cooker at a temperature of about 80° C. to about 140° C. The cooked starch can be transferred to a main mix tank for subsequent processing.

The functional organosilane coupling agent(s) can be at least partially hydrolyzed by reaction with the organic hydrocarbon acid in the presence of water. Preferably, in a separate mix tank, acetic acid is added to cold (about 10° C. to about 30° C.) water and the functional organosilane coupling agent is added thereto. When the temperature in the main mix tank is less than about 60° C. the silane mixture is added to the main mix tank.

The N-vinyl amide polymer can be premixed with warm water (about 50° C.) and added to the main mix tank. The wax component, any non-ionic lubricant, emulsifier and wetting agent are premixed in warm water (about 70° C.) under high shear conditions and added to the main mix tank. The biocide, fungicide, and any other ingredients desired can be added to the main mix tank. Preferably, each component is diluted in water in a separate tank and well mixed before being combined with the other components in a main mixing tank. After each of the premixed ingredients is added to the main mix tank, sufficient water is added to provide the aqueous forming size composition with a total solids content of about 1 to about 10 weight percent.

The forming size compositions of the present invention can be applied to any type of fiberizable glass composition known to those skilled in the art. Glass fibers suitable for use in the present invention include those prepared from fiberizable glass compositions such as "E-glass", "621-glass", "A-glass", "C-glass", "S-glass", "ECR-glass" (corrosion resistant glass) and fluorine and/or boron-free derivatives thereof. Such compositions are well known to those skilled in the art and are disclosed in Loewenstein, *The Manufacturing Technology of Continuous Glass Fiber* (2d Ed. 1983) at pp. 33–45, which is hereby incorporated by reference.

The aqueous forming size composition can be applied to the glass fibers in a variety of conventional ways, for example, by dipping the glass fibers in a bath containing the composition, by spraying the composition upon the glass fibers or by contacting the glass fibers with an applicator such as a roller or belt applicator. In the preferred embodiment, the aqueous forming size composition is applied by a belt or roller applicator. Non-limiting examples of such applicators and other suitable applicators are disclosed in Loewenstein at pages 169–177, which is hereby incorporated by reference.

The amount of the size composition applied to the glass fibers can vary based upon such factors as the size and number of glass fibers. For a plurality of glass fibers, the amount of aqueous forming size composition having about 0.5 to about 20 weight percent solids applied to the fibers can be about 0.1 to about 40 weight percent of the total weight of the glass fibers including the forming size composition, and preferably, about 1 to about 20 weight percent.

After application of the forming size composition to the glass fibers, the glass fibers are typically dried, for example air dried or dried in a conventional or vacuum oven at a temperature of about 220° F. to about 300° F. for about 10 to about 13 hours to produce glass fiber strands having a dried residue of the forming size composition thereon.

Suitable ovens for drying glass fibers are well known to those skilled in the art. The temperature and time for drying the glass fibers will depend upon such variables as the percentage of solids in the forming size composition, components of the forming size composition and type of glass fiber. Drying of glass fiber forming packages or cakes is discussed in detail in Loewenstein at pages 224–230, which is hereby incorporated by reference.

Preferably, the solids of the forming size composition on the glass fibers is about 0.01 to about 8 weight percent (solids of the forming size composition divided by the total weight of the glass and dried forming size composition, also known as loss on ignition or "LOI"), and more preferably about 0.2 to about 3 weight percent. The glass fibers having the dried forming size composition applied thereto can be twisted and can have applied thereon a secondary treatment or coating composition. For glass fiber strands to be used in the weaving process, a warp sizing composition can be applied to the sized glass fiber after warping or beaming. Such warp sizing compositions typically include components such as polyvinyl alcohol and are well known to those skilled in the art. The glass fiber strands can be included, for example, as a warp strand 10 and/or weft strand 12 of a woven fabric 14, as shown in FIG. 1.

The secondary treatment or coating composition can also be an impregnating composition such as are disclosed in Loewenstein at page 253, which is hereby incorporated by reference, and U.S. Pat. Nos. 4,762,750 (col. 5, line 58 through col. 15, line 64; col. 17, lines 16–46; and col. 19, line 28 through col. 26) and 4,762,751, (col. 6, line 21 through col. 14, line 68 and col. 16, line 49 through col. 25, line 23) which are hereby incorporated by reference or a Teflon® polytetrafluoroethylene coating, for example.

The glass fiber strands can be further processed by twisting into a yarn, chopping, combination in parallel to form a bundle or roving, weaving into a cloth or forming into a chopped or continuous strand mat, as discussed above. The glass fiber strands can be twisted by any conventional twisting technique known to those skilled in the art, for example by using twist frames. Generally, twist is imparted to the strand by feeding the strand to a bobbin rotating at a speed which would enable the strand to be wound onto the bobbin at a faster rate than the rate at which the strand is supplied to the bobbin. Generally, the strand is threaded through an eye located on a ring which traverses the length of the bobbin to impart twist to the strand, typically about 0.5 to about 3 turns per inch.

The twisted strands can be used to prepare woven or non-woven fabrics, knitted or braided products, or reinforcements. Fabric can be woven using any conventional loom, such as a shuttle loom, air jet loom, rapier loom or other weaving machine.

The coated strands can be used in a wide variety of applications, such as cloth for printed circuit boards and overwrap reinforcements for optical fiber cables, for example.

The present invention will now be illustrated by the following specific, non-limiting example.

EXAMPLE

Each of the components in the amounts (weight percent or wt. %) set forth in Table 1 were mixed to form aqueous forming size compositions. Sample No. 1 is an aqueous forming size composition prepared according to the present invention. Each aqueous forming size composition was prepared in a similar manner to that discussed above.

TABLE 1

| | Sample No. | | | |
|---|---|---|---|---|
| | 1 | | 2 | |
| COMPONENT | grams per 10 gallons | wt. % on total solids basis | grams per 10 gallons | wt. % on total solid basis |
| Starch | | | | |
| NATIONAL 1554[1] | 603.9 | 23.8 | | |
| AMAIZO 213[2] | 603.8 | 24.5 | | |
| HI-SET 369[3] | — | — | 1348 | 51.2 |
| polyvinyl pyrrolidone[4] | 114.7 | 4.8 | — | — |
| cetyl palmitate[5] | 613.2 | 27.3 | — | — |
| emulsifier[6] | 91.4 | 3.9 | 93 | 4.2 |
| emulsifier[7] | 30.6 | 1.4 | — | — |
| silylated polyamine cationic lubricant[8] | 116.1 | 2.6 | — | — |
| cationic lubricant[9] | — | — | 183 | 3.1 |
| nonionic lubricant[10] | 263.8 | 11.7 | 466 | 21.5 |
| salt of a poly-amino functional polyamide resin | — | — | 112 | 3.9 |
| humectant[11] | — | — | 273 | 12.5 |
| amino silane[12] | — | — | 83 | 2.7 |
| defoamer[13] | — | — | 17 | 0.9 |
| biocide[14] | 0.5 | — | 0.5 | — |
| acetic acid | 18.0 | — | 33 | — |

[1]NATIONAL 1554 low amylose crosslinked potato starch which is commercially available from National Starch and Chemical Corp. of Bridgewater, New Jersey.
[2]AMAIZO 213 high viscosity, crosslinked starch which is commercially available from American Maize Company of Hammond, IN.
[3]HI-SET 369 propylene oxide modified corn starch having an amylose/amylopectin ratio of about 55/45 which is commercially available from National Starch Company of Bridgewater, New Jersey.
[4]PVP K-30 polyvinyl pyrrolidone homopolymer which is commercially available from ISP Technologies, Inc. of Wayne, New Jersey.
[5]KESSCO or STEPHANLUBE 653 cetyl palmitate which is commercially available from Stephan Company of Maywood, New Jersey.
[6]TMAZ 81 ethylene oxide derivative of a sobitol ester emulsifier which is available from PPG Industries, Inc. of Pittsburgh, PA.
[7]IGEPAL CA-630 ethoxylated octylphenoxyethanol emulsifier which is commercially available from Rhone Poulenc of Princeton, New Jersey.
[8]ALUBRASPIN 227 cationic silylated polyamine polymer lubricant which is manufactured by PPG Industries, Inc. of Pittsburgh, Pennsylvania and is disclosed in U.S. Pat. No. 5,354,829.
[9]ALUBRASPIN 261 cationic alkyl imidazoline derivative lubricant which is commercially available from PPG Industries, Inc..
[10]ECLIPSE 102 hydrogenated soybean oil nonionic lubricant which is commercially available from Van den Bergh Food Company of Lisle, Illinois.
[11]MACOL E-300 polyethylene glycol humectant which is commercially available from PPG Industries, Inc.
[12]An amino silane which is commercially available from OSi Corp. of Danbury Connecticut.
[13]MAZU DF-136 defoamer which is commercially available from PPG Industries, Inc.
[14]Methylene-bis-thiocyanate (Chemtreat CL-2141) which is commercially available from ChemTreat, Inc. of Ashland, Virginia.

Each of the aqueous forming size compositions of Table 1 were coated onto G-75 E-glass fiber strands. The forming size composition of Sample No. 1 had 5.9 weight percent solids and a pH of about 5.29. The forming size composition of Sample No. 2 had about 6 weight percent solids.

Each coated glass fiber strand was twisted to form a yarn and wound onto bobbins in a similar manner using conventional twisting equipment.

The yarns of Samples 1 and 2, as well as a sample of NEG Y-105 yarn (Sample No. 3), which is commercially available from Nippon Electric Glass of Japan, were evaluated for a variety of physical characteristics, the results of which are set forth in Table 2.

The average loss on ignition (weight percent of solids of the forming size composition divided by the total weight of the glass and dried forming size composition) of three trials of each Sample is set forth in Table 2.

Each yarn was evaluated for weavability using a Tsudacoma Model No. 103 air jet loom. The average of 200 measurements of insertion time for each yarn is listed in Table 2. These measurements were conducted at 510 insertions (picks) per minute at a main air jet pressure of 3.9 bars while weaving a 50 inch wide Style 7628 fabric.

Each yarn was also evaluated for average number of broken filaments per 1000 yards of yarn and average yarn tension (grams) using a broken filament detector of the type disclosed in U.S. Pat. No. 4,610,707. These values represent the average of measurements conducted on eight bobbins of each yarn (each bobbin having about 130,000 yards of yarn wound thereon) at a speed of 500 yards per minute, a temperature of about 21° C. (70° F.) and a relative humidity of about 60 percent.

The results of subjective observations of halos, shedding and lint are set forth in Table 2. Halos and lint are broken filament buildups at tensioning devices, such as whorls, and other contact points in the broken filament detector creel. Binder shedding occurs when the sizing powderizes.

The moisture adsorption for each yarn was evaluated by subjecting samples of each yarn to about 98% relative humidity for about 18 hours. The moisture adsorption results are listed in Table 2.

The wet-out of each yarn in a slashing solution was evaluated using a modified version of the Draves test (the standard Draves test is ASTM D-2281). An 80 yard sample (about 5 grams) of each yarn was configured into a bundle about 50.8 millimeters (2 inches) long and about 12.7 millimeters (½ inch) wide. A large beaker (at least 2000 milliliters) was filled with an 8.1 weight percent solids aqueous solution of ELVANOL T-66 slashing solution at a temperature of about 52° C. (125° F.). Each bundle was individually placed on the surface of the slashing solution and the elapsed time for the bundle to be submerged beneath the surface of the liquid solution was measured. In the standard Draves test, a 3 gram weight is attached to the bundle to facilitate sinking. However, attaching a 3 gram weight to these types of yarns often causes them to sink too rapidly to permit reliable measurements to be taken. Therefore, this testing was conducted without adding any weight to the bundle. The temperature of the slashing solution was also modified from the standard Draves test temperature of 25° C. (77° F.) to 52° C. (125° F.) for this testing to simulate an actual slashing operation. The average wet-out of five samples of each yarn is given in Table 2.

TABLE 2

|  | Sample 1 | Sample 2 | Sample 3 |
|---|---|---|---|
| LOI (weight percent) | 1.08 | 1.12 | 1.10 |
| Insertion time (seconds) | 0.0728 | 0.0742 | 0.0734 |
| Number of fuzzballs per million end yards | 0.7 | 1.4 | — |
| Yarn tension (grams) | 25.4 | 30.7 | 26.3 |
| Number of broken filaments per 1000 yards of yarn | 1.87 | 3.95 (3.23) | 1.77 |
| Number of halos | very light | light | very light |
| Shedding | light | light | medium |
| Lint | light | medium | very light |
| Moisture Adsorption (weight percent) | 0.27 | 0.64 | 0.37 |
| Wet-out (seconds) | 6.8 | 9.4 | 243 |

As shown in Table 2, Sample No. 1 (prepared according to the present invention) has a lower insertion time, lower tension, and faster wet-out when compared to Samples No. 2 and 3, which are not believed to be coated with a forming size composition comprising an ester of a monocarboxylic acid and a monohydric alcohol, as is Sample No. 1. Also, Sample No. 1 has less broken filaments, fuzz, halos, shedding, lint and moisture adsorption than Sample No. 2 (which does not have an ester of a monocarboxylic acid and a monohydric alcohol in its forming size composition).

From the foregoing description, it can be seen that the present invention comprises an aqueous forming size composition which provides glass fibers treated therewith having minimum fuzz and halos, low broken filaments, low strand tension, adequate wet-out in slashing and high fliability and low insertion time in weaving.

It will be appreciated by those skilled in the art that changes could be made to the embodiments described above without departing from the broad inventive concept thereof. It is understood, therefore, that this invention is not limited to the particular embodiments disclosed, but it is intended to cover modifications which are within the spirit and scope of the invention, as defined by the appended claims.

Therefore, we claim:

1. A fiber strand comprising a plurality of fibers having deposited thereon the dried residue of an aqueous forming size composition comprising:
    (a) an oleophobic starch;
    (b) a film-forming material which is a N-vinyl amide polymer;
    (c) a wax component comprising an ester formed from reacting (1) a monocarboxylic acid and (2) a monohydric alcohol;
    (d) an emulsifying agent for the wax component; and
    (e) a cationic lubricant different from the wax component; the aqueous forming size composition being essentially free of: (1) oleophilic starches; (2) polyolefin emulsions; and (3) preservatives selected from the group consisting of organometallic compounds, formaldehydes, derivatives and mixtures thereof.

2. The sized fiber strand of claim 1, wherein the dried residue of the aqueous forming size composition has a loss on ignition of about 0.01 weight percent to about 8 weight percent of the total weight of the plurality of fibers and dried residue of the aqueous forming size composition.

3. The sized fiber strand of claim 1, having applied to at least a portion thereof a warp slashing composition.

4. The fiber strand according to claim 1, wherein the oleophobic starch of the aqueous forming size composition is selected from the group consisting of starches having a viscosity of less than or equal to about 100 centipoise at a temperature of about 38° C., starches having a viscosity of greater than about 100 centipoise at a temperature of about 38° C., starches having an amylose content of less than or equal to about 40 weight percent, starches having an amylose content of greater than 40 weight percent, derivatives of the starches and mixtures thereof.

5. The fiber strand according to claim 1, wherein the oleophobic starch is present in the aqueous forming size composition in an amount from about 10 to about 90 weight percent on a total solids basis.

6. The fiber strand according to claim 1, wherein the N-vinyl amide polymer of the aqueous forming size composition is prepared from a monomer selected from the group consisting of N-vinyl-2-pyrrolidone, N-vinyl-2-piperidone, N-vinyl-ε-caprolactam, N-vinyl-5-methyl-2-pyrrolidone, N-vinyl-3,3,5-trimethyl-2-pyrrolidone, N-vinyl-3-methyl-2-pyrrolidone, isomers, derivatives and mixtures thereof.

7. The fiber strand according to claim 6, wherein the n-vinyl amide polymer is a homopolymer of N-vinyl-2-pyrrolidone.

8. The fiber strand according to claim 1, wherein the n-vinyl amide polymer is present in the aqueous forming size composition in an amount from about 0.1 to about 30 weight percent on a total solids basis.

9. The fiber strand according to claim 1, wherein the wax component is present in the aqueous forming size composition in an amount from about 5 to about 50 weight percent of the aqueous forming size composition on a total solids basis.

10. The fiber strand according to claim 1, wherein the ester of the wax component of the aqueous forming size composition is a solid having a melting point of from about 35° C. to about 135° C.

11. The fiber strand according to claim 1, wherein at least one of the monocarboxylic acid and the monohydric alcohol of the ester of the wax component comprises an aliphatic chain having about 12 to about 32 carbon atoms.

12. The fiber strand according to claim 1, wherein the monocarboxylic acid of the aqueous forming size composition is selected from the group consisting of lauric acid, tridecanoic acid, myristic acid, pentadecanoic acid, palmitic acid, margaric acid, stearic acid, nonadecanoic acid, arachidic acid, behenic acid, lignoceric acid, cerotic acid, melissic acid, and mixtures thereof.

13. The fiber strand according to claim 1, wherein the monohydric alcohol of the aqueous forming size composition is selected from the group consisting of lauryl alcohol, n-tridecyl alcohol, myristal alcohol, n-pentadecyl alcohol, cetyl alcohol, margaryl alcohol, stearyl alcohol, n-nonadecyl alcohol, arachidyl alcohol, ceryl alcohol, myricyl alcohol, and mixtures thereof.

14. The fiber strand according to claim 1, wherein the ester of the wax component of the aqueous forming size composition is selected from the group consisting of cetyl palmitate, cetyl myristate and mixtures thereof.

15. The fiber strand according to claim 1, wherein the cationic lubricant of the aqueous forming size composition is selected from the group consisting of amine salts of fatty acids, alkyl imidazoline derivatives, acid solubilized fatty acid amides, acid solubilized polyunsaturated fatty acid amides, silylated polyamine polymers and mixtures thereof.

16. The fiber strand according to claim 15, wherein the cationic lubricant is a silylated polyamine polymer which is prepared by reacting:
(a) an amino functional reaction product of an aminofunctional polymer having primary or secondary amine functionality and the residue of a fatty acid moiety; and
(b) an amine-reactable organo alkoxy silane and hydrolysis products thereof.

17. The fiber strand according to claim 1, wherein the cationic lubricant of the aqueous forming size composition is present in the aqueous forming size composition in an amount from about 0.01 to about 15 weight percent on a total solids basis.

18. The fiber strand according to claim 1, wherein the aqueous forming size composition further comprises a non-ionic lubricant.

19. The fiber strand according to claim 1, wherein the aqueous forming size composition further comprises a functional organosilane coupling agent.

20. The fiber strand according to claim 1, wherein the N-vinyl amide polymer is the sole film-forming polymer other than the oleophobic starch in the aqueous forming size composition.

21. The fiber strand according to claim 1, wherein the aqueous forming size composition is essentially free of humectants.

* * * * *